(12) United States Patent
Stanley

(10) Patent No.: US 7,778,324 B2
(45) Date of Patent: Aug. 17, 2010

(54) SYSTEM FOR DYNAMIC TIME OFFSETTING IN INTERLEAVED POWER AMPLIFIERS

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 753 days.

(21) Appl. No.: 11/283,035

(22) Filed: Nov. 18, 2005

(65) Prior Publication Data

US 2007/0116109 A1    May 24, 2007

(51) Int. Cl.
*H03K 7/08* (2006.01)

(52) U.S. Cl. ............... 375/238; 320/145; 327/26; 327/31; 327/36; 329/312; 332/109; 340/825.63; 370/205; 370/212

(58) Field of Classification Search .......... 307/66; 330/10; 375/238
See application file for complete search history.

(56) References Cited

U.S. PATENT DOCUMENTS

| | | | | |
|---|---|---|---|---|
| 3,585,517 | A |  | 6/1971 | Herbert ............... 330/10 |
| 4,700,148 | A |  | 10/1987 | Pauly ............... 331/154 |
| 4,968,948 | A | * | 11/1990 | Tokumo et al. ........... 330/10 |
| 5,014,016 | A |  | 5/1991 | Anderson ............... 330/10 |
| 5,289,046 | A | * | 2/1994 | Gregorich et al. ........... 307/66 |
| 5,657,219 | A |  | 8/1997 | Stanley ............... 363/132 |
| 5,767,740 | A |  | 6/1998 | Fogg ............... 330/10 |
| 6,262,632 | B1 |  | 7/2001 | Corsi et al. |
| 6,373,336 | B1 | * | 4/2002 | Anderskouv et al. ......... 330/10 |
| 6,683,494 | B2 |  | 1/2004 | Stanley ............... 330/10 |

| | | | |
|---|---|---|---|
| 2006/0097678 | A1 | * 5/2006 | Alberkrack et al. ......... 318/439 |

FOREIGN PATENT DOCUMENTS

| | | |
|---|---|---|
| DE | 3939616 A1 | 7/1990 |
| JP | 02-177607 | 7/1990 |
| JP | 03-297208 | 12/1991 |
| JP | 05-315856 | 11/1993 |
| JP | 2002-521949 | 7/2002 |
| JP | 3421680 | 4/2003 |
| JP | 2005-142780 | 6/2005 |

(Continued)

OTHER PUBLICATIONS

Forejt, Brett et al., "A 700+-mW Class D Design With Direct Battery Hookup in a 90-nm Process," *IEEE Journal of Solid-Sate Circuits*, vol. 40, No. 9, 2005, pp. 1880-1887.

(Continued)

*Primary Examiner*—David C Payne
*Assistant Examiner*—Adolf Dsouza
(74) *Attorney, Agent, or Firm*—Brinks Hofer Gilson & Lione

(57) ABSTRACT

A system for controlling the delay applied to one branch of a pulse width modulation amplifier. The delay typically incorporated whether input signal level is low and diminished when the input signal level increases. The system may be implemented using a switch, a level detector and a timer, which in conjunction determine whether the delay unit is included in the branch or bypassed. The system may also use a programmable delay that can adjust the period of delay applied or be programmed to operate as a pass-through where delay is no longer beneficial for providing high signal quality.

39 Claims, 13 Drawing Sheets

FOREIGN PATENT DOCUMENTS

JP        2006-512004        4/2006

OTHER PUBLICATIONS

Zhang, Kai et al., "Reduction of Common Mode EMI in a PWM Inverter through Fine-Tuning Gating Signals," *IEEE Conference on Industrial Electronics and Applications*, 2006, pp. 1-4.

Behad Rezari, "Design of Analog CMOS Integrated Circuits," McGraw-Hill, pp. 512-522.

Understanding Class-I, http://www.crownaudio.com/amp_htm/amp_info/bca.htm, Nov. 16, 2005, 6 pages.

Reinventing the Power Amplifier—BCA, Crown International (1998), 7 pages.

H.S. Black, "Modulation Theory", Princeton, NJ: Van Nostrd, 1953.

G.R. Stanley and K.M. Bradshaw, "Precision DC-to-AC Power Conversion by Optimization of the Output Current Waveform—The Half Bridge Revisited", IEEE Trans. On Power Electronics, vol. 14, No. 2, Mar. 1999.

The Class-I Amplifier, Crown Audio, Inc. (2003), 3 pages.

Tech Made Simple: Class I (BCA), Crown Audio, Inc. (2003), 1 page.

Chinese Office Action w/English translation dated Oct. 17, 2008, for Chinese Application No. 200610147033.4, 13 pgs.

Chinese Office Action (English translation) dated Aug. 7, 2009, for Chinese Application No. 200610147033.4, 8 pgs.

Japanese Office Action (English translation) dated Nov. 6, 2009, for Japanese Patent Application No. 2006-305597, 7 pgs.

Chinese Office Action w/English translation, dated Feb. 25, 2010, pp. 1-7, Chinese Patent Application No. 200610147033.4, Chinese Patent Office.

\* cited by examiner

SYSTEM FOR DYNAMIC TIME OFFSETTING IN INTERLEAVED POWER AMPLIFIERS

BACKGROUND OF THE INVENTION

1. Technical Field

The invention generally relates to pulse width modulation (PWM) amplifiers and, more particularly, to an interleaved pulse width modulation amplifier having a time offset that may be incorporated or removed, or increased or decreased.

2. Related Art

Pulse width modulation (PWM) amplification for audio applications has been used to increase efficiency by incorporating output devices that act as switches. In PWM amplifiers, an audio input signal is represented by pulse width modulated waveform. Specifically, an inputted audio signal modulates the width of an ultrasonic rectangular waveform. The modulated waveform is then low-pass filtered, and the resultant analog signal is used to drive the load or loudspeaker. As opposed to linear mode amplification, the transistors that amplify the signal operate in saturation mode being either fully on or fully off. The output transistors are aligned in half-bridge pairs such that one produces a more positive voltage, while the other produces a more negative voltage.

The most common form of pulse width modulated amplifiers, known as class-D amplifiers, are theoretically 100% efficient because the output transistors are either completely on, or completely off. These amplifiers, however, are problematic because the switching of the transistors must be very precisely controlled.

In a class-D amplifier, the switches operate in time alternation. Ideally, the switches are timed perfectly such that one transistor instantaneously turns off, while the other instantaneously turns on. Realistically, however, there may be a delay before a transistor provides an output. The time between the conduction intervals of the two switches when neither switch is on is known as deadtime. Deadtime results in a loss of control that produces distortion and therefore should be minimized. Conversely, with insufficient deadtime, a timing error could cause both the positive and negative switching transistors to be on at the same time. While the time of the overlap may be small, it creates a high shoot-through current that could destroy the output transistors.

To address this issue, Crown Audio developed the opposed current converter, the features of which are discussed in U.S. Pat. No. 5,657,219. In the opposed current converter, alternatively designated as a BCA® (Balanced Current Amplifier) or class-I amplifier, the positive and negative switching pulses are interleaved instead of alternating. Where the audio input signal is at a zero-crossing, i.e. where no signal is to be outputted, the switches turn on and off simultaneously at a 50% duty cycle. As a result the positive and negative signals cancel each other out, a null output signal is provided. Where the incoming signal is going positive, the duty cycle of the positive switch increases, and the duty cycle of the negative switch decreases. Where the incoming signal is going negative, the converse occurs.

One reason why the class-I amplifier is advantageous is that the pulses are centered on each other, and not on when one signal turns off. The class-I amplifier also requires less low-pass filtering to eliminate the switching signal from the output. Further discussion of the class-I amplifier may be found in the U.S. Pat. No. 5,657,219, the inventor's white paper, "Reinventing the Power Amplifier—BCA," and Crown Audio's Understanding Class-I primer, which are incorporated by reference.

When constructing interleaved PWM amplifiers, circuits are designed to reduce the amount that the switches crosstalk to avoid the scenario in which the decision process of one would be based upon the results of another. The problem of crosstalk is enhanced where signal levels are small. This is because even a minor timing error represents a relatively large distortion compared to the ideal response. The potential for crosstalk distortion is most acute with integrated circuit PWM amplifiers in which the multiple modulators and output stages all share a common substrate and package.

To address crosstalk problems, one may time delay the main switching signal for some of the various signal paths of an interleaved amplifier such that fewer of the small signal modulation event edges coincide in time. This technique is shown for an interleave of two full-bridge amplifier in U.S. Pat. No. 6,373,336 by Anderskouv & Risbo. As shown in FIG. 1, such a system incorporates a time delay element 140 in one of the PWM branches. This system claims to addresses the problem of inadvertent zero-crossing distortion due to crosstalk by introducing a time delay that effectively moves the switching noise of one modulator and power stage to a non-zero signal portion of the modulation cycle of the second modulator and power stage. Alternatively, a modulating waveform may be delayed in one pulse width modulator branch, thereby creating a time offset with respect to the other pulse width modulator branch. The introduction of hysteresis in the modulator can also be used to create delay.

FIG. 1 is an example of a simple interleaved PWM amplifier modulator 100 that receives an input signal from a signal source 110. The amplifier modulator 100 splits the input into two branches. The first branch includes an inverting block 120 The inverting block 120 is connected with a first pulse width modulator 130, referenced as PWM A. PWM A 130 is connected with a first half-bridge 150, referenced as half bridge A. The output of half-bridge A 150 is then connected with the load 160.

The second branch includes a non-inverting block 125 that is connected with a second pulse width modulator 135, referenced as PWM B. PWM B 135 is connected with a delay unit 140. The delay unit 140 is connected to a second half-bridge 155, referenced as half-bridge B. Half-bridge B 155 is then connected with the load 160.

In this system, the cross-talk noise that may otherwise result in distortions that are audible when near input signal zero-crossing conditions are "pushed" away from the zero-crossing by the introduction of a delay by the delay unit 140. The result is an error that can be more easily audibly masked by the now larger signal that is required to bring the noise making output into time coincidence with the other modulator's moment of switching. The introduction of delay approach, however, has limitations that make it inappropriate to use in certain conditions. A primary problem with this approach is that when the time offset is added, feedback signals are corrupted. Because of the addition of the time delay, pulse width modulation signals are also affected. Thus, PWM spectra that were formerly suppressed, may appear as distortion in the audible frequency spectrum.

SUMMARY

By adding time delay to one branch of an interleaved pulse width modulator, the cross-talk noise can be moved from a near-zero crossing of the input signal to a higher signal level. This purported benefit, however, also has the effect of corrupting feedback signals with the appearance of PWM spectra that, without the introduction of the delay would be suppressed. Where the signal level is small, the distortion introduced by these sidebands is nearly zero. Where the signal level increases, however, the introduced delay's harm outweighs its benefits.

To address these scenarios, when delay should be introduced and/or the amount of delay introduced may be controlled. By analyzing the level of the inputted source, a pulse width modulation amplification system can assess whether a time delay should be included in one of the branches of the pulse width modulation amplifier. Alternatively, the levels can be analyzed by examining the pulse width waveforms present in one or more of the branches. The analysis may include an assessment of the amount of the signal level and the amount of time in which the level is within a signal range.

This system may be implemented in a variety of ways. For example, a bypass circuit that is controlled by a switch may be introduced. The bypass circuit may circumvent the time delay circuitry present in one branch of the PWM amplifier. Where the signal levels are low, the time delay circuitry is included in the circuit. When the signal levels are sufficiently high, the switch may connect the bypass circuit. To ensure that excessive switching between operating modes does not occur, a timer may be incorporated into the system. The timer may ensure that the bypass circuit will be connected or disconnected when the levels are within a suitable range for a sufficient period of time.

In another system, programmable time delay circuitry may be utilized. In this regard, the timer can instruct the time delay circuitry to increase or decrease the time delay introduced into the PWM branch. In this system, a switch may still be used to connect a bypass circuit. Alternatively, the time delay circuitry and timer could operate in conjunction to reduce the delay progressively towards zero instead of using a switch. In designs that phase shift the modulating triangle waveform to create delay, the phase shift can be reduced towards zero. For example if the phase shift is created with a phase-locked-loop's phase detector being offset from the traditional zero degrees of lock error, the phase detector offset can be reduced back to zero and the delay in the modulator may be removed.

The control of the time delay could also be implemented by a microprocessor that analyzes the signal levels, performs a timing function, and instructs the delay circuitry to operate merely as a bypass, or to introduce a predetermined or adjustable amount of delay. Indeed, the functionality of the time delay could be performed by the microprocessor.

As noted above, the analysis of the input signal can be performed by examining one or both of the pulse width modulated signals. Instead of using a microprocessor, the analysis could be performed in a less complex manner, such as incorporating a latch or detector that examines the leading or trailing edges of the pulse width modulated signals and instructs the timer to start counting. When the timer has reached a suitable timeframe, without being reset by a different output of the latch, a switch may connect a bypass circuit.

As used herein, the term delay unit refer to any hardware or software implementation in which of time offset may be introduced. The delay unit may comprise software instructions operated by a controller or microcontroller that serve to introduce a time offset. Alternatively, the delay unit may comprise an analog CMOS integrated circuit. Tunable delay elements as used in a ring oscillator may be utilized. Hysteresis may be introduced into a comparator that compares an input signal to a modulating triangle waveform in a pulse width modulator. Time offsets may be generated through propagation times in stages or gates. The delay unit may be implemented in numerous ways.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
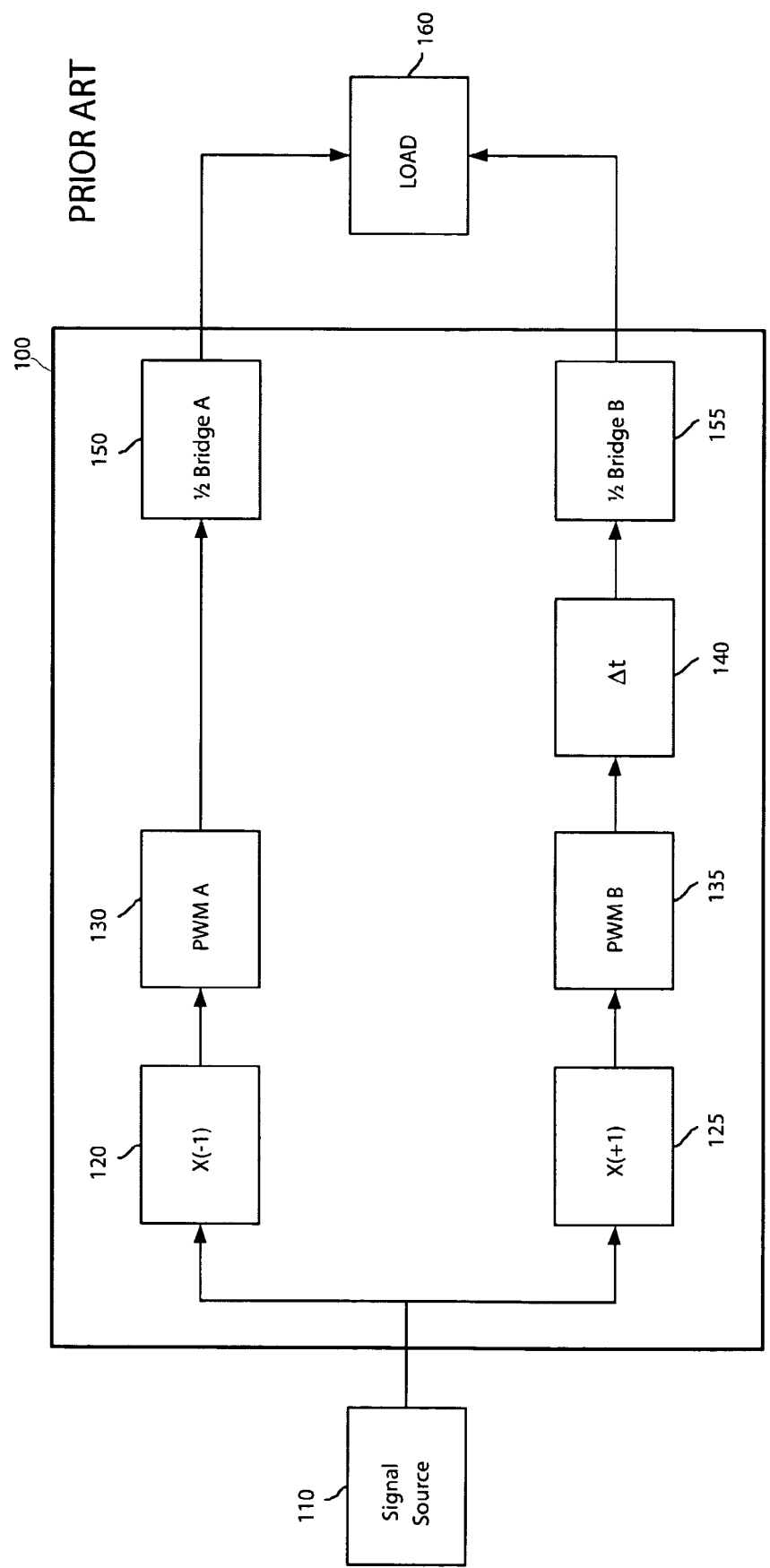
FIG. 1 is a block diagram of a prior art system for introducing time delay in one branch of an interleaved pulse width modulation amplifier.

The invention may be addressed in greater detail by first considering the effects of introducing a time delay in an interleaved pulse width modulation amplifier. The output signal spectrum of a natural double-sided PWM process is represented as:

$$y_0(t) = MV_0\cos(\omega_s t) + \left(\frac{4V_0}{\pi}\right)\sum_{m=1}^{\infty}\frac{1}{m}\left[\sum_{n=-\infty}^{\infty}J_n\left(\frac{Mm\pi}{2}\right)\sin\left(\frac{(m+n)\pi}{2}\right)\cos(m\omega_c t + n\omega_s t)\right] \quad \text{(Equation 1)}$$

M is the modulation index where $0 \leq M \leq 1.0$ $\omega_s$ is the signal frequency in radians/second $\omega_c$ is the PWM carrier/switching frequency in radians/second $V_o$ is the peak output voltage of the PWM waveform m is the integer harmonic order number of the carrier band $1 \leq m \leq \infty$ n is the sideband order number $-\infty \leq n \leq \infty$ The leading cosine term is the intended signal for a process whose input is a cosine of radian frequency $\omega_s$ and whose amplitude relative to the modulating triangular waveform is of proportion M. The triangle waveform is given in unity amplitude cosine form as:

$$v(t) = \frac{8}{\pi^2} \sum_{m=1,3,5...}^{\infty} \frac{1}{m^2} \cos(m\omega_c t) \qquad \text{(Equation 2)}$$

The second part of (Equation 1) is composed of harmonics (m) of the modulating triangle and sideband pairs (±n) about each harmonic. The amplitude of each sideband is given by a Bessel function of the first kind (order n), a function of the modulation index and harmonic order. Since m and n are always integers, the product sine term has three possible values, −1, 0 and +1. When m+n is even, the sine term is zero and there is no sideband (or carrier when n=0). In other words, even harmonics have only sidebands that are spaced by odd multiples of the signal frequency, and odd harmonics have only even multiples of the signal frequency including a carrier harmonic.

The feedback of a sideband whose n=1 produces a gain error and not a distortion. Terms whose n=0 and whose m is odd create DC offset errors. These ripple signals result in harmonic distortion when they produce intermodulation signals that lie within the signal passband of the amplifier. For an audio amplifier that signal passband would be less than or equal to 20 KHz. Harmonic signals that lie well outside the passband may also be measured.

One method of reducing undesired spectrum in the output is to use an interleaved power stage. When optimally formed using natural double-sided PWM, interleave may result in the suppression of all harmonic orders and their sidebands for all bands other than those modulo with the interleave number N.

The output spectrum of such an interleaved PWM power stage is given in by:

$$y_0(t) = MV_0\cos(\omega_s t) + \left(\frac{4V_0}{\pi}\right)\sum_{p=1}^{\infty}\frac{1}{pN}\left[\sum_{n=-\infty}^{\infty}J_n\left(\frac{MpN\pi}{2}\right)\sin\left(\frac{(pN+n)\pi}{2}\right)\cos(pN\omega_c t + n\omega_s t)\right] \qquad \text{(Equation 3)}$$

N is the integer interleave order $1 \leq N \leq \infty$ pN is the integer harmonic number and $1 \leq p \leq \infty$ When N=1 the above expression is identical to (Equation 1) as expected. Wherever m had appeared in (Equation 1), now pN appears and reveals that the interleave has suppressed all bands of order m that were not modulo N. Those bands (m) that remain as integer (p) multiples of N have identical sideband and carrier harmonics as in (Equation 1).

When delay is added to some of the PWM signals, the summations may no longer result in complete suppression of the bands that lie between the multiples of N. The amplitudes of the multiples of N may be very slightly reduced, but this is generally of little import.

In the simple case of N=2 as shown in FIG. 1, there are two PWM signal streams being summed at the output of the full-bridge power stage. To delay one by Δt is to phase shift each spectral line of a frequency $\omega_x$ by $\theta=\Delta t \cdot \omega_x$, which results in a summation of two such sidebands of relative intensity:

$$\Psi = \sqrt{\frac{(1-\cos(\theta))}{2}} \qquad \text{(Equation 4)}$$

Where $\Psi$ is the new weight applied to each spectral line in (Equation 1) that would have been cancelled in (Equation 3). Note than when θ=0, so does ψ. When θ=π then all sideband suppression is lost as ψ=1.

Figure 2:
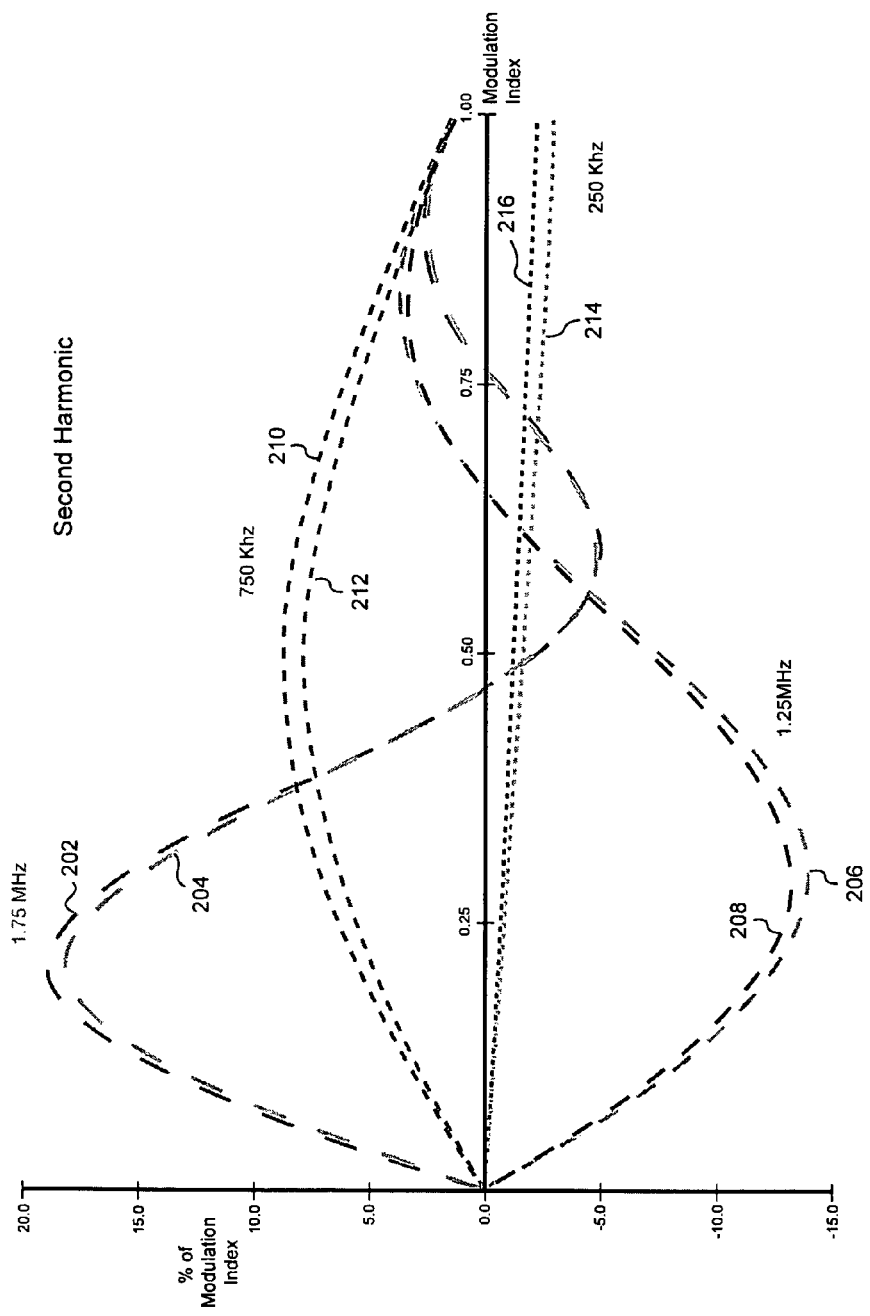
FIGS. 2, 3, and 4 are graphs of the second, fourth, and sixth harmonics of 250 KHz, 750 Khz, 1.25 MHz, and 1.75 MHz sidebands as a function of the modulation of a time delayed signal.
Figure 3:
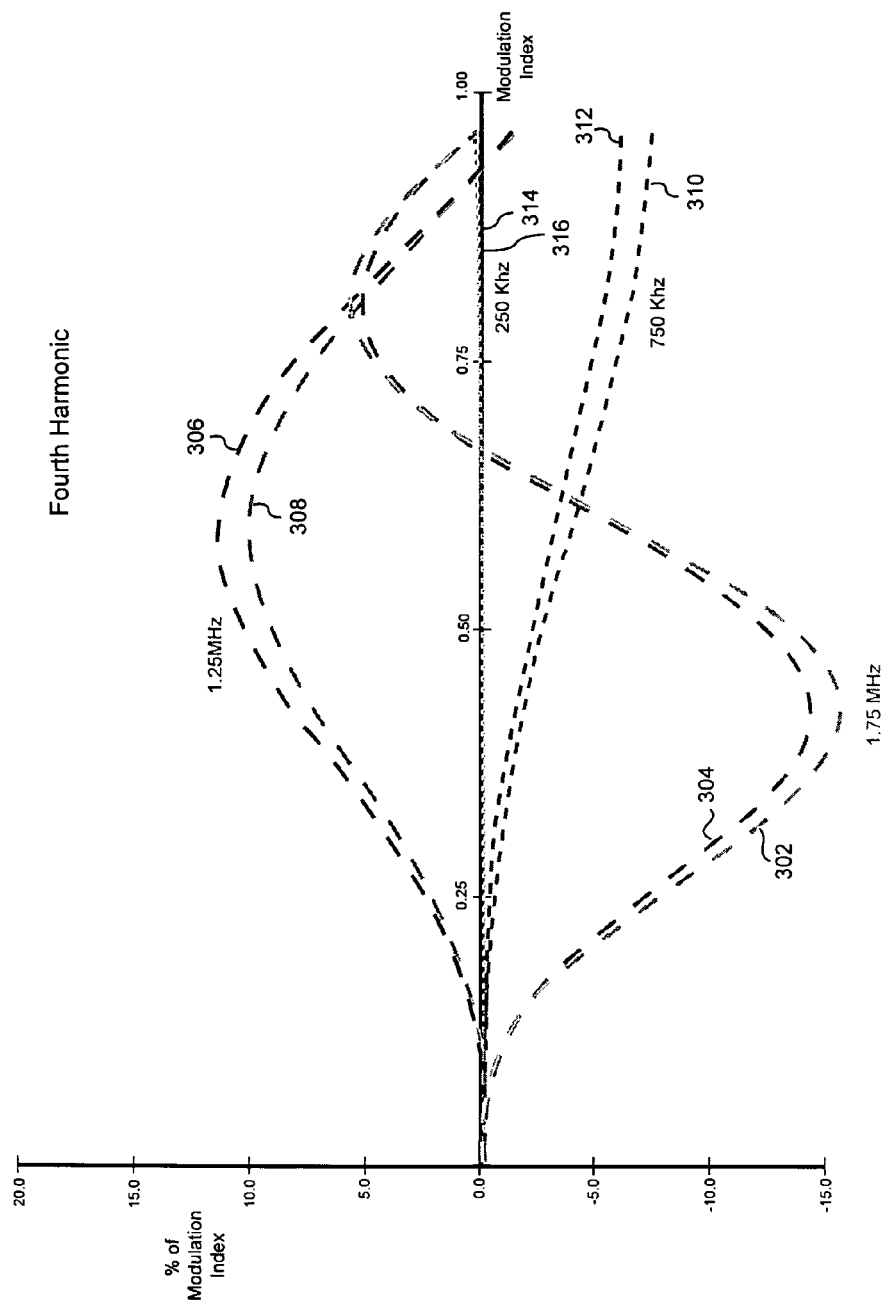
Figure 4:
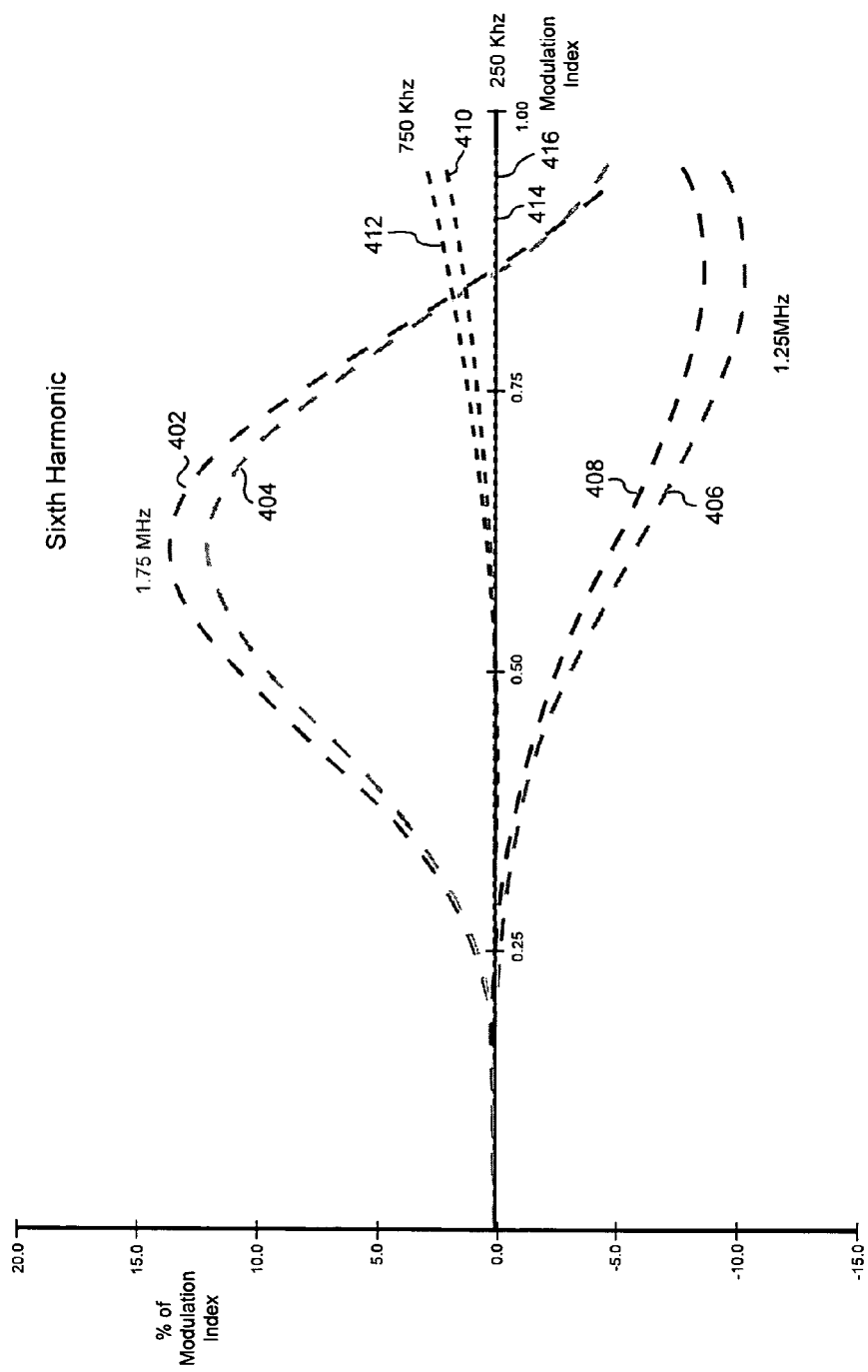

An example of the distortion that may be introduced is shown with reference to FIGS. 2, 3, and 4. For example, if a system, such as shown in FIG. 1, utilizes switching performed at 250 KHz, an input signal that is a sine wave at 20 KHz, and a Δt of 100 nsec. The sidebands that are ±40 KHz about all of the odd multiples of 250 KHz are plotted vs. modulation index M and normalized thereto as a percentage of M.

If these signals were to be reintroduced into the modulation process as feedback signals, they can emerge as second harmonic (40 KHz) distortion in the output signal as shown in FIG. 2. The actual amount of such signals that would be reinserted may be a function of the feedback filtering employed. Typically, the loop gain would be greater for the lower sideband than for the upper sideband, and it would therefore be of more import than the upper sideband. Since the angle θ is larger for the upper sideband than for the lower sideband, the lower sideband is the larger of the two. The upper and lower sidebands may appear in pairs.

The sidebands that are ±80 KHz about all of the odd multiples of 250 KHz are likewise shown in the example of FIG. 3. These signals if reinserted in the modulation process become the fourth harmonic.

The sidebands that are ±120 KHz about all of the odd multiples of 250 KHz are likewise shown in the example of FIG. 4. These signals if reinserted in the modulation process become the sixth harmonic.

In FIGS. 2, 3, and 4, the initial small signal (small M) distortion effect that could be caused by such sidebands in feedback signals is zero. However as M increases, the results deteriorate rapidly. In FIG. 2, the 1.75 Mhz sidebands 202 centered at 1.75 MHz (upper@1.79 MHz) and 204 (lower@1.71 MHz), the 1.25 Mhz sidebands 206 centered at 1.25 MHz (upper@1.29 MHz) and 208 (lower@1.21 MHz), and the 750 KHz sidebands 210 centered at 750 kHz (upper@790 KHz) and 212 (lower@710 KHz) increase rapidly. The 250 KHz sidebands centered at 250 kHz 214 (upper@290 KHz) and 216 (lower@210 KHz), on the other hand, may incorporate approximately 2-3% distortion at full modulation. In this regard, the 250 KHz sidebands 214 and 216 may be the most problematic because they may be the most difficult to eliminate via filtering due to their lower frequency:

In FIG. 3, the fourth harmonics yield 250 KHz sidebands 314 and 316 that are even flatter, yet being centered about 250 KHz are more difficult to filter/remove. Similarly, in FIG. 4, the 250 KHz sidebands 414 (upper@370 KHz) and 416 (lower@130 KHz) are not visible and the 750 KHz sidebands 410 (upper@870 KHz) and 412 (lower@630 KHz). Yet, the lower frequencies (i.e. 130 KHz) will typically have a more difficult to remove waveform. Accordingly, in instances in which the modulation increases, the delay may be more of a hindrance than an aid.

Figure 5A:
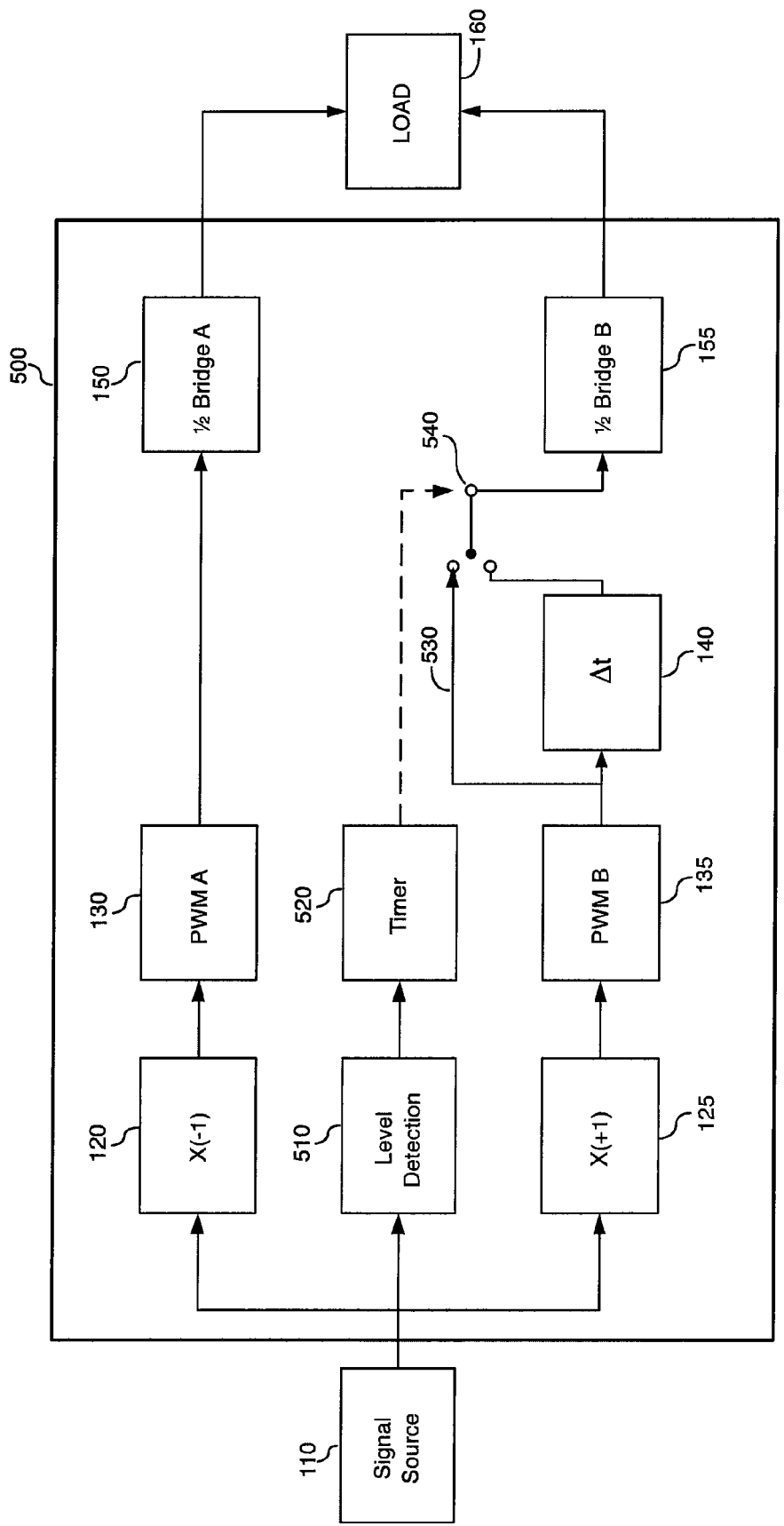
FIGS. 5A-C are block diagrams of exemplary interleaved pulse width modulation amplification systems.

FIG. 5A depicts an example of a pulse width modulation amplification system that may eliminate the delay where appropriate. Accordingly, when the signal becomes sufficient such that delay is deemed to be no longer helpful, it may be bypassed in favor of a system without delay or a reduced delay system. This example incorporates a bypass connection 530 and is operable when switch 540 is set in a first position shown in FIG. 5A as the upper position. When the switch is in a second position, shown in FIG. 5A as the lower position, the delay is incorporated into the system.

Because the switching itself, if performed too rapidly or frequently could create a notable distortion, the example depicted in FIG. 5A also includes a level detector 510 and timer 520. The timer 520 may ensure that the bypass circuit will not be enabled and/or disabled until a predetermined period of time has passed. Although the timer 520 may be set to any period of time, one desirable period of time may be 20 mSec. From a psycho-acoustic perspective there may be no benefit to switching faster than once every 20 mSec. The timer may be implemented in a variety of different forms. For example in a predominantly digital environment, a resettable counter/timer may be employed. In an analog environment, a resettable monostable may be used.

The level detector may measure the level of the signal source, and instruct the timer when to start, stop, and/or reset. If a determined level of detection is achieved, the level detector 510 may instruct the timer 520 to start timing/counting. The timer 520 may send a signal to the switch 540 that instructs the switch 540 to switch positions and connect to connection 530, thereby bypassing the delay unit 140. Every time the predetermined level is sensed, the timer 520 may reset to the initial timing/counting state. Timing or counting may proceed only when the level is below the predetermined level of detection. After a predetermined period of time has been reached without the predetermined level being achieved, the switch 540 may beset to the lower position, so that the time delay is reincorporated into the system. Conversely, where the level detected remains above the threshold for a determined length of time, the switch 540 may be set in the upper position to allow the bypass circuit 530 to connect signals output by pulse width modulator B 135 to half-bridge B 155, thereby circumventing the delay introducing element 140.

Figure 5B:
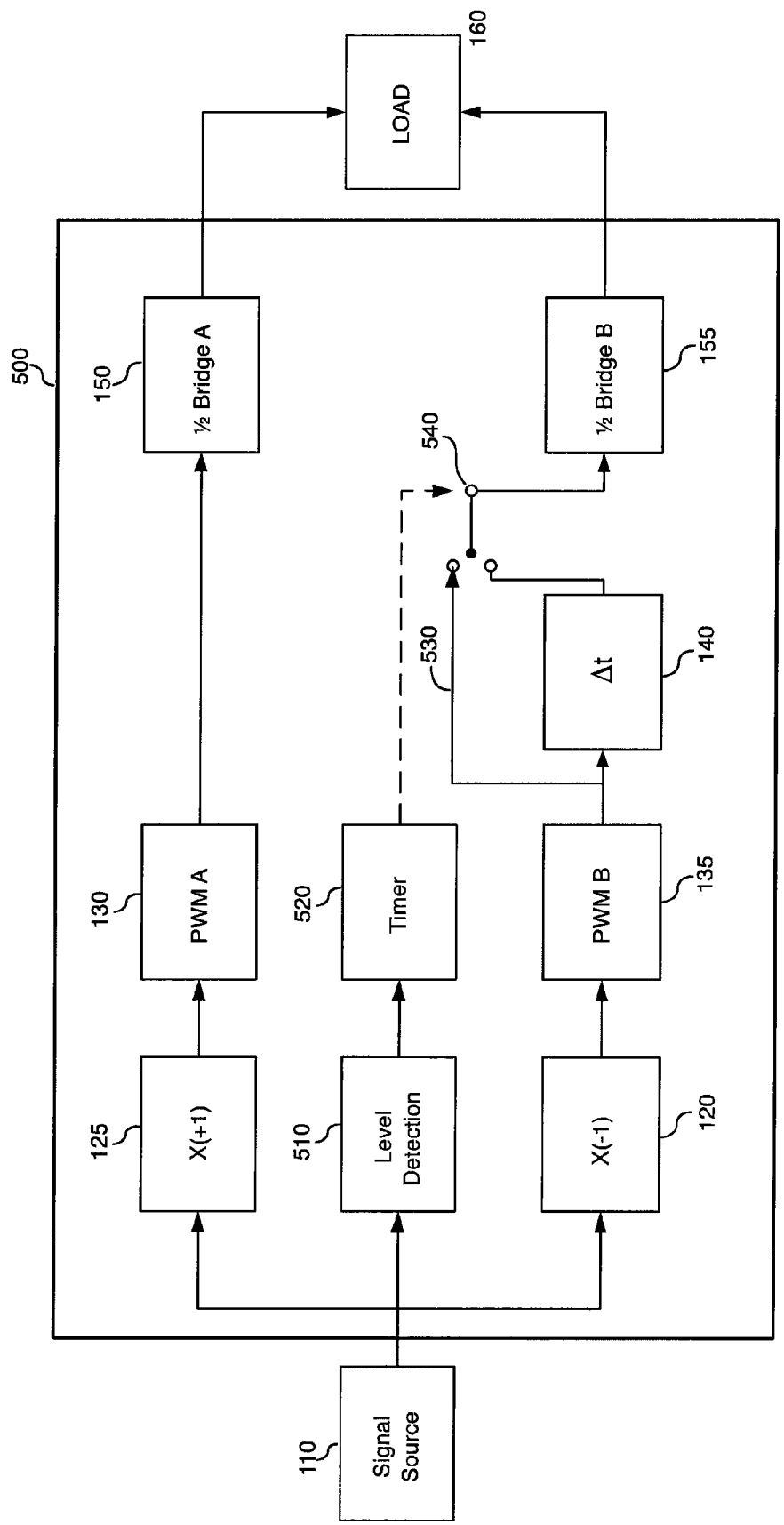
Figure 5C:
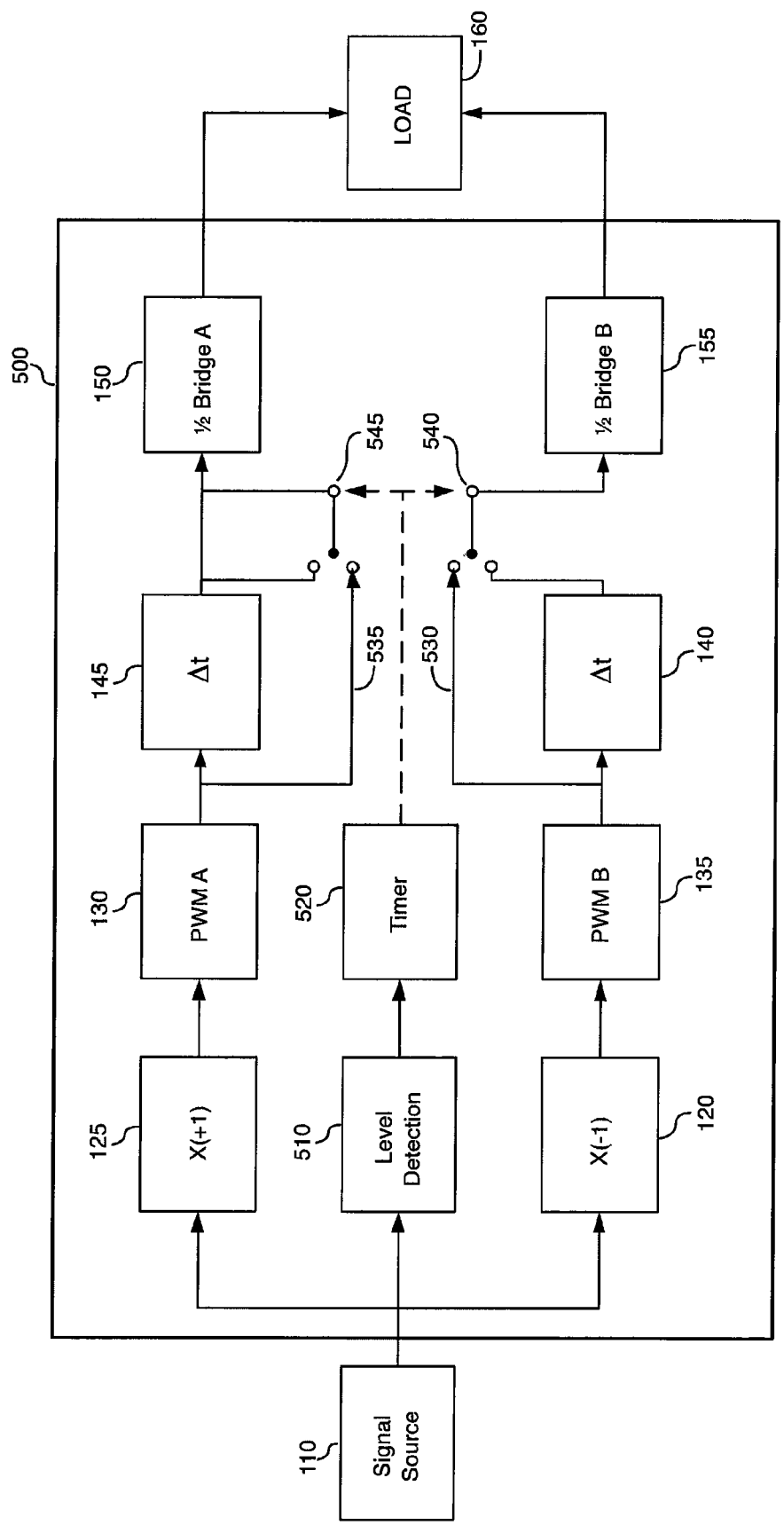

Although the block diagram depicts pulse width modulator B 135 and delay introducing element 140 as separate elements, they can be combined in a single unit. For example, pulse width modulator B 135 may provide a time delayed signal with respect to the output of pulse width modulator A 130. For example, if pulse width modulators 130 and 135 are driven by a triangular waveform, a time offset may be introduced by delaying the triangular waveform driving pulse width modulator A 130 or pulse width modulator B 135. Further, the system may be implemented with either the inverting or non-inverting block connected to pulse width modulator A 130. In FIG. 5A, the inverting block 120 is connected with pulse width modulator A 130 and non-inverting block 125 is connected with pulse width modulator B 135. As shown in FIG. 5B, non-inverting block 125 may be connected with pulse width modulator A 130 and inverting block 120 may be connected with pulse width modulator B 135. Also, the system may be implemented with delays added to half-bridge A, as well as half-bridge B. An exemplary system is shown in FIG. 5C, which includes additional delay unit 145, connection 535, and switch 545 between pulse width modulator A 130 and half-bridge A 150.

Figure 6:
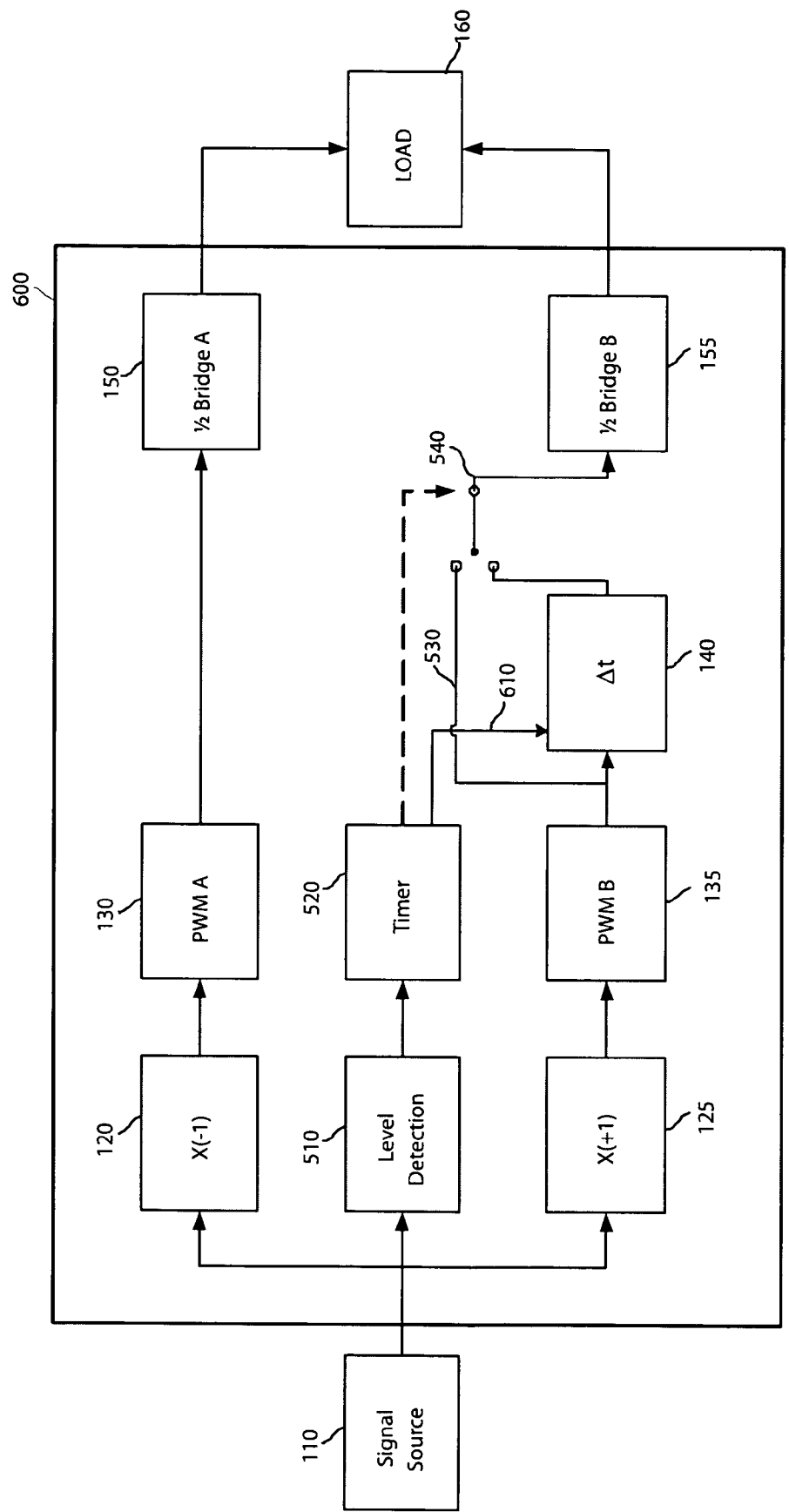
FIG. 6 is block diagram of an interleaved pulse width modulation amplification system that controls whether a time delay is introduced and the amount of delay that is introduced.

In another example, pulse width modulation amplification system 600 as shown in FIG. 6, the delay 140 may be adjustable. Delay adjustment line 610 depicts a connection between an output of the timer 520 and an input to the delay 140. Alternatively, the output of the level detector 510 may connect to the delay 140.

Figure 7:
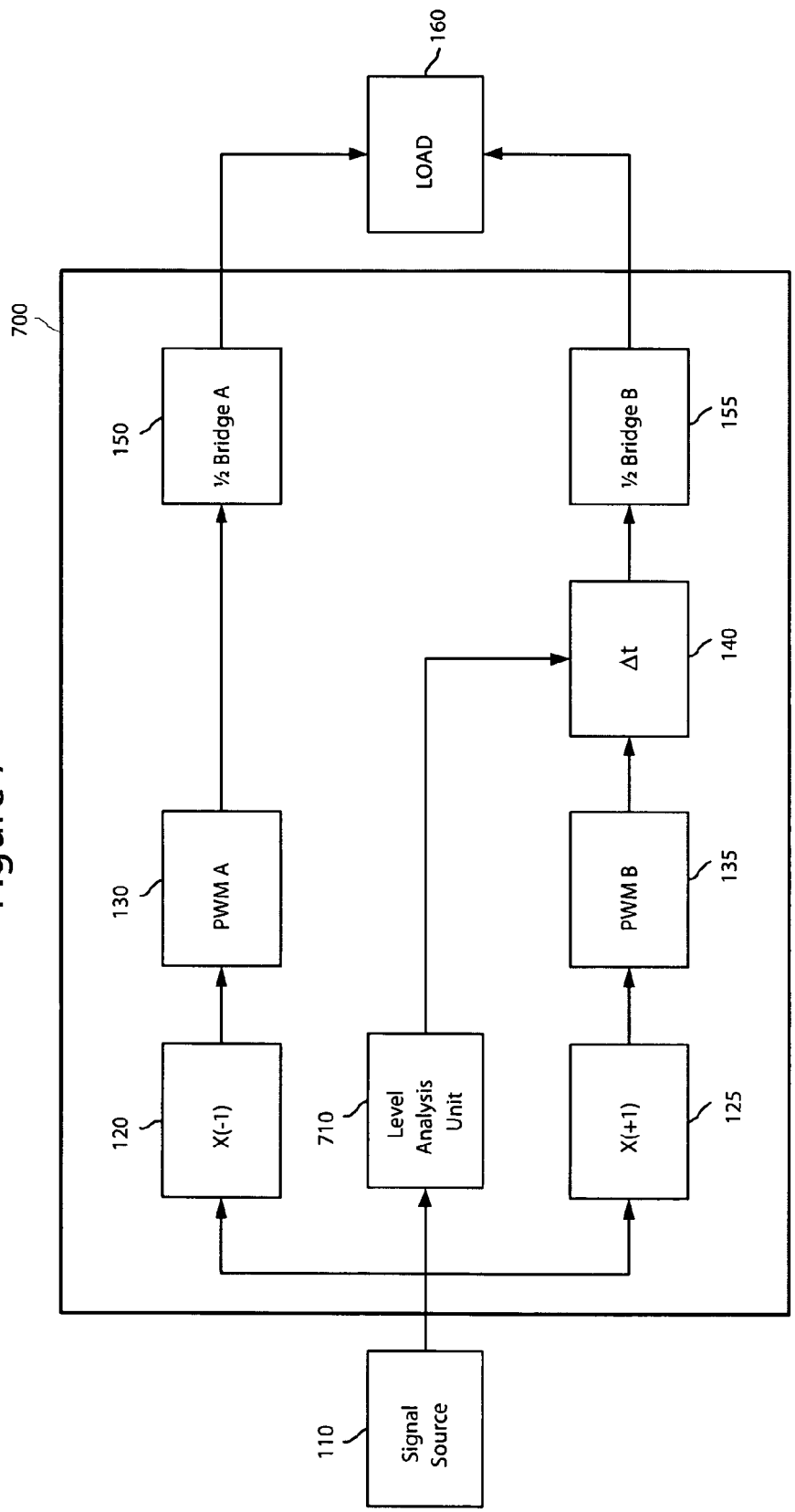
FIG. 7 is a block diagram of another interleaved pulse width modulation amplification system that controls whether a time delay is introduced and the amount of delay that is introduced.

Although the level detector 510, timer 520, circuit bypass 530, and switch 540 are shown as separate elements in FIGS. 5 and 6, some or all of these elements may be integrated together. Further, in FIG. 7, the level detector 510 and timer 520 may be combined into a single level analysis unit 710. The level analysis unit 710 may contain a set of instructions operated by a microprocessor. The level analysis unit 710 may be the set of instructions or a microprocessor executing the set of instructions. In this regard, the level analysis unit 710 may assess the signal source 110 and control the delay 140. In this example, the delay 140 is dynamically adjustable to provide either no delay (serve simply as a passthrough) or an amount of delay selected by the level analysis unit 710.

Alternatively, if there is already an existing time offset between the outputs of pulse width modulator A 130 and pulse width modulator B 135, the time offset may be reduced by delaying the modulating waveform in one of the modulators 130 and 135, or by introducing a separate delay unit that will introduce a delay that will serve to diminish the time offset between the outputs of the pulse width modulators 130 and 135. Similarly, the time offset may be increased by delaying the modulating waveform in one of the modulators 130 and 135, or by introducing a separate delay unit that will introduce a delay that will serve to augment the time offset between the outputs of the pulse width modulators 130 and 135.

Figure 8:
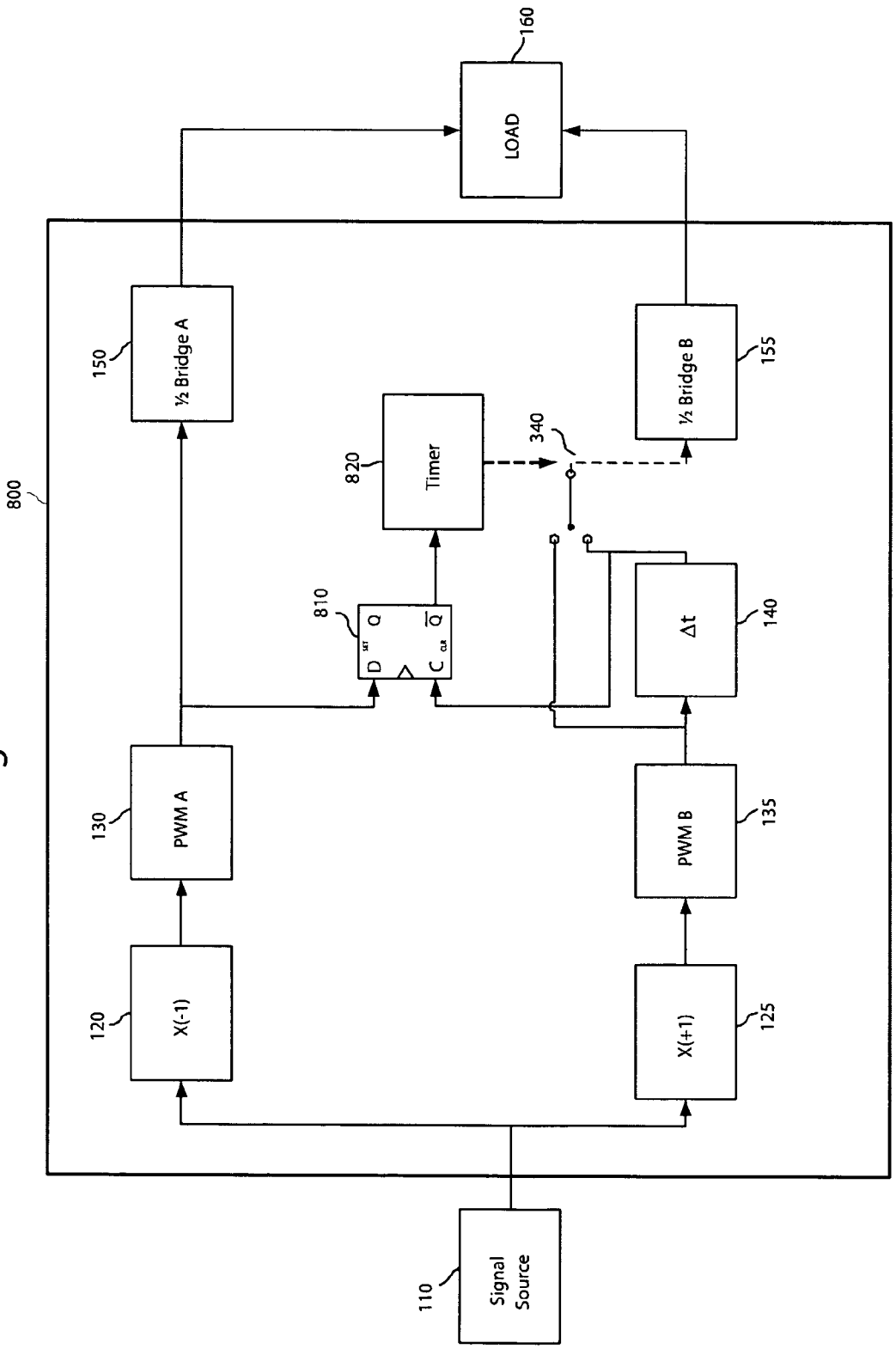
FIG. 8 depicts a pulse width modulation amplification system that controls whether time delay is introduced.

FIG. 8 depicts an example pulse width modulation amplification system 800 that includes a level detector 810 and timer 820. The level detector 810 is implemented by edge sensitive logic to determine when the time delay has been overcome by the modulation. In the illustrated example, the level detector 810 is a type D flip-flop. In other examples, a distortion driven level criterion may be implemented.

One input of level detector 810 may be connected to the output of pulse width modulator A 130. The other input may be connected to the output of the delay unit 140. In FIG. 8, input D is connected with pulse width modulator A 130 and input C is connected with the output of the delay unit 140. Alternatively, input C may be connected with pulse width modulator A 130 and input D may be connected with the output of the delay unit 140. As such, the level detector 810 will switch output states when either the PWM A 130 edge transitions or the delay unit 140 transitions first. Consequently, the timer 820 may then reset. In this manner, the switch 340 may only change after the timer 820 has reached a sufficient amount of time, and the timer 820 is only activated when a sufficient level is detected from PWM A 130 or the delay unit 140.

Alternatively, during operation the delay may be selectively varied. The selectively varied delay may be smoothly reduced towards zero as the signal level increases. If a delayed version of the modulating waveform is deployed in the modulator, it can produce an analogous (but not identical) effect as a delay in the PWM output.

Figure 9:
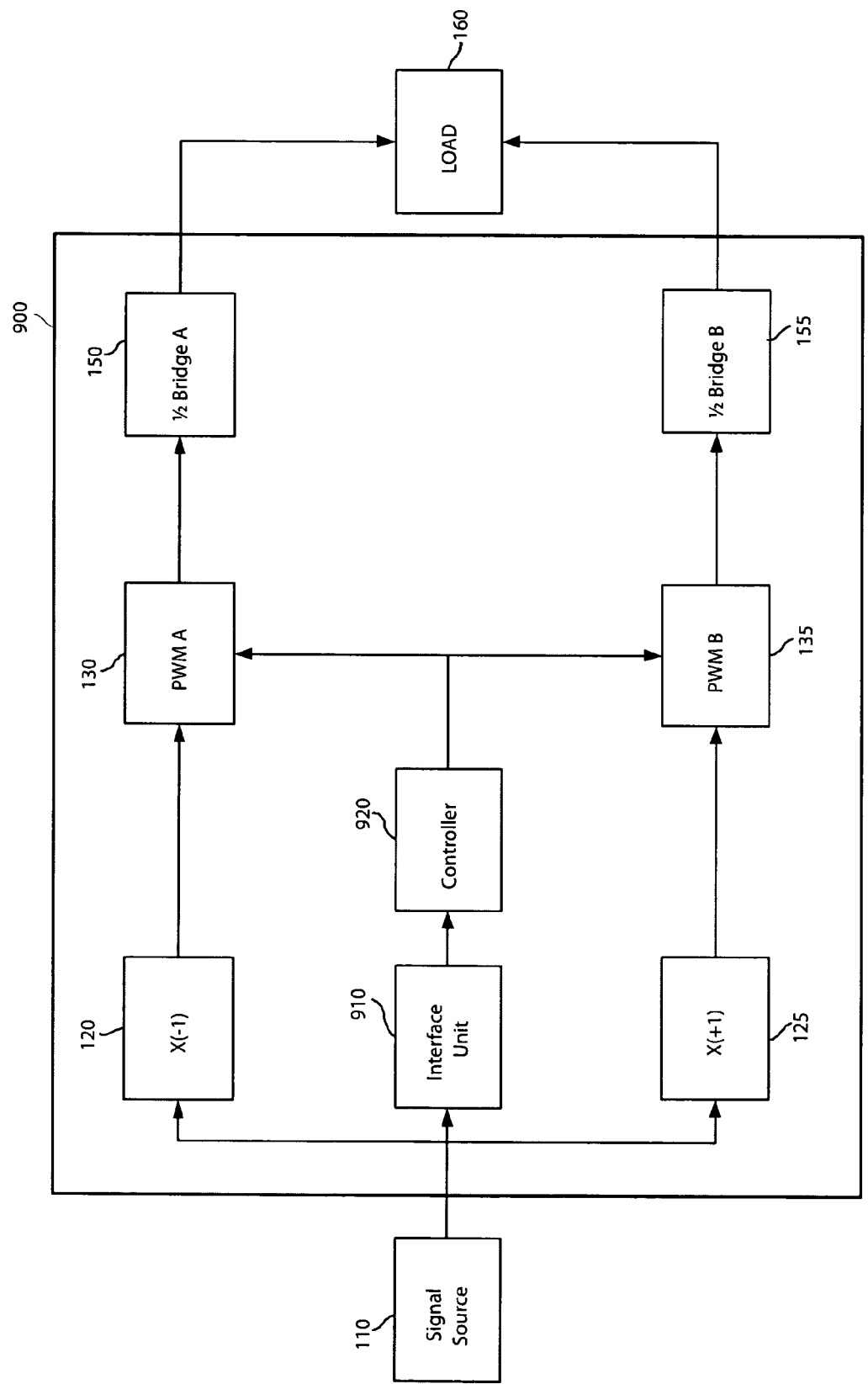
FIG. 9 is a block diagram of yet another interleaved pulse width amplification system that controls whether a time delay is introduced and the amount of delay that is introduced.

FIG. 9 depicts an example pulse width modulation system 900 incorporating an interface unit 910 and a controller 920. In FIG. 9, PWM A 130, PWM B 135, or both pulse width modulators 130 and 135 may delay a modulating waveform to generate a time offset, as discussed above. In this regard, controller 920 may direct one of the pulse width modulators 130 and 135 to delay the modulating waveform. The delaying of one modulating waveform may be used to increase or decrease a time offset. Alternatively, both pulse width modulators 130 and 135 may be directed to implement differing amounts of delay to increase, decrease, or attempt to eliminate time offsets. Further, the controller 920 may direct the same delay, or no delay at all, to be applied to the pulse width modulators 130 and 135.

The controller 920 may receive data from the interface unit 910, which is connected with the signal source 110. The interface unit 910 may function as a level detector, an analog to digital converter, a pre-processor, or a combination of the three. In general, its purpose to provide the controller 920 with data based on the signal source 110. The data supplied may be an assessment of whether the level of the signal source 110 is greater than a threshold, a frequency spectrum analysis, noise analysis, etc. From this data, the controller 920 may assess what delay, if any, should be applied by pulse width modulator A 130 and/or pulse width modulator B 135. The controller 920 and interface unit 910 may be contained on a single integrated circuit or as separate elements.

The controller 920 may incorporate the functionality of both a level detector and a timer. For example, the interface unit 910 may sample the signal source 110 and provide the controller 920 with digital data from which the controller 920 may calculate the level of the signal source, the duration in which the signal source has been above (or below) a level threshold, and whether the duration of time that the signal source has been above (or below) has reached a duration threshold.

Alternatively, the controller 920 may adjust the level or duration thresholds according to received data. The controller 920 may also utilize a variety of different analyses, with or without level or duration thresholds, to calculate whether delay should be deliberately introduced, the amount of delay to introduce, and whether the delay should be reduced.

Figure 10:
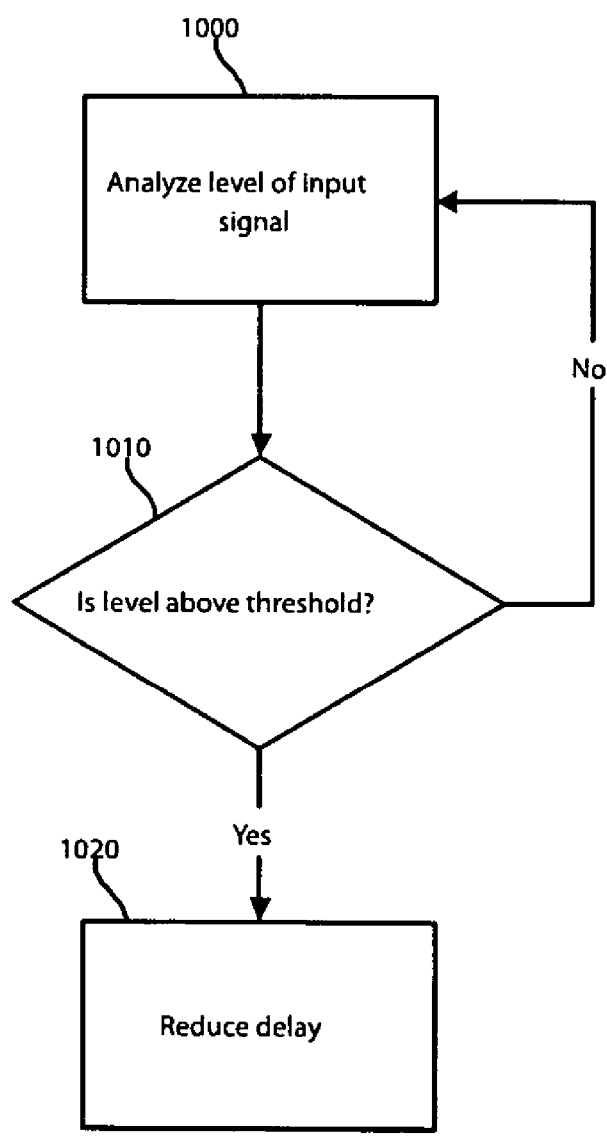
FIG. 10 is a flowchart showing a method of controlling a time offset in an interleaved pulse width modulation amplification system.

FIG. 10 shows an example method of controlling a time offset in an interleaved pulse width modulation amplifier. In step 1000, the input signal level is analyzed. Next, in step 1010, the input signal is evaluated to assess if the input is above at least one input threshold. If the input signal is below the threshold, the method returns to step 1000. If the input signal is above the input threshold, the delay (time offset) is reduced in step 1020.

Figure 11:
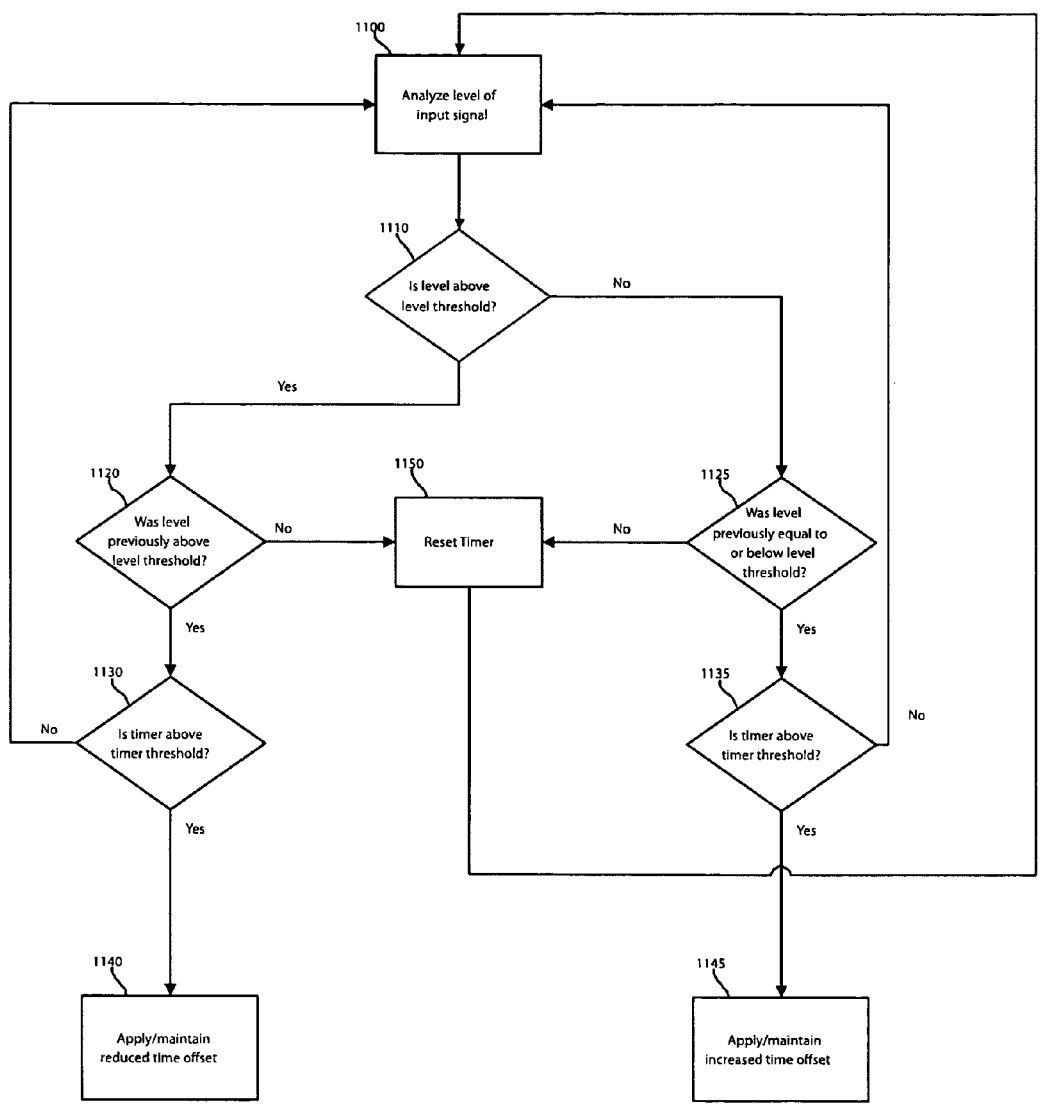
FIG. 11 is a flowchart showing another method of controlling a time offset in an interleaved pulse width modulation amplification system.

FIG. 11 shows another example method of controlling a time offset in an interleaved pulse width modulation amplifier. In step 1100, the input signal level is analyzed. In step 1110, the input signal is assessed to determine if it is above the level threshold. If it is above the level threshold, the system determines if the level was previously above the level threshold in step 1120. If the level was not previously above the level threshold, the timer is reset in step 1150 and the system will return to step 1100.

At step 1110, it is determined that the input level is equal to or below the level threshold, the system determines if it was previously equal to below the level threshold in step 1125. If the level was not previously equal to or below the level threshold, the timer is reset in step 1150 and the system will return to step 1100.

If the system finds that the level was previously above the level threshold in step 1120 (or equal to or below the level threshold in step 1125), the system queries if the timer is above the timer threshold in step 1130 (or in step 1135 for equal to or below threshold signals). If the time threshold has not been exceeded, the system returns to step 1100.

If the timer threshold has been exceeded at block 1130, and the level is above the threshold, the system will reduce the time offset between the two pulse width modulated signals in step 1140. If the system has already applied a reduced time offset, the system will maintain the reduced time offset. At this step, the system has determined that the level of the input signal has been sufficiently high for what is deemed to be a substantial period of time. As a result, it is determined that the time offset is not beneficial, and thus is reduced. The reduction may be partial or designed to substantially eliminate the time offset. Alternatively, the reduction may be applied in steps or as a function of the period of time and/or amount that the input signal is above the threshold. The application or maintenance of the reduced time offset can be implemented in a variety of ways, examples of which have been described.

If the timer threshold has been exceeded and the level is equal to or below the threshold, the system will increase the time offset between the two pulse width modulated signals in step 1145. If the system has already applied an increased time offset, the system will maintain the increased time offset. At this step, the system has determined that the introduction of a time offset level will be beneficial, and thus increases or maintains an increased time offset level. Alternatively, the increase in time offset may be applied in steps or as a function of the period of time and/or amount that the input signal below the threshold. The application or maintenance of the increased time offset can be implemented in a variety of ways, examples of which have been described.

While various embodiments of the invention have been described, it will be apparent to those of ordinary skill in the art that many more embodiments and implementations are possible within the scope of the invention. For example, there are many embodiments of delay generators and how they may be modulated or bypassed. Accordingly, the invention is not to be restricted except in light of the attached claims and their equivalents.

I claim:

1. A pulse width modulation amplification system, comprising:
    a first pulse width modulator operable to receive an input signal and generate a first pulse width modulated signal therefrom, the first pulse width modulator connected with a first switch-mode power stage and operable to be connected with a load;
    a second pulse width modulator, the second pulse width modulator operable to receive the input signal and generate a second pulse width modulated signal therefrom that is time offset with respect to the first pulse width modulated signal, the second pulse width modulator connected with a second switch-mode power stage and operable to be connected with a load;
    a level detector operable to determine a level of the input signal; and
    a controller operable to, based on the level of the input signal, automatically instruct the second pulse width modulator to adjust the amount by which the second pulse width modulated signal is time offset with respect to the first pulse width modulated signal.

2. The pulse width modulation amplification system of claim 1 where the first and second pulse width modulators utilize triangular modulating waveforms.

3. The pulse width modulation amplification system of claim 1 where the first and second switch-mode power stages comprise two half-bridges of a full-bridge interleaved power converter.

4. The pulse width modulation amplification system of claim 1 where the first and second switch-mode power stages comprise positive and negative current halves of an opposed current converter.

5. The pulse width modulation amplification system of claim 1 further comprising a timer connected with the level detector and the controller.

6. The pulse width modulation amplification system of claim 1 where the level detector and controller are contained on an integrated circuit.

7. The pulse width modulation amplification system of claim 1 where the first pulse width modulator, the second pulse width modulator, the level detector, and the controller are contained on an integrated circuit.

8. The pulse width modulation amplification system of claim 1 where the input signal is digital signal audio.

9. The pulse width modulation amplification system of claim 1 where the input signal is analog signal audio.

10. The pulse width modulation amplification system of claim 1 further comprising an inverting block connected with the input signal and the first pulse width modulator and a non-inverting block connected with the input signal and the second pulse width modulator.

11. The pulse width modulation amplification system of claim 1 further comprising a non-inverting block connected with the input signal and the first pulse width modulator and an inverting block connected with the input signal and the second pulse width modulator.

12. A pulse width modulation amplification system, comprising:
   a first pulse width modulator operable to receive a signal and output a first pulse width modulated signal, the first pulse width modulator connected with a first switch-mode power stage and operable to be connected with a load;
   a second pulse width modulator, the second pulse width modulator operable to output a second pulse width modulated signal that is interleaved with the first pulse width modulated signal, the second pulse width modulator connected with a second switch-mode power stage and operable to be connected with a load;
   a level detector operable to analyze the level of an input signal;
   a delay unit connected with the level detector and the second pulse width modulator and operable to automatically adjust a time offset of the second pulse width modulated signal with respect to the first pulse width modulated signal; and
   a bypass circuit operable in response to an output from the level detector to circumvent the delay unit in a first state, and incorporate the delay unit in a second state.

13. The pulse width modulation amplification system of claim 12 where the first and second pulse width modulators are driven by respective triangular modulating waveforms.

14. The pulse width modulation amplification system of claim 12 where the first and second switch-mode power stages comprise two half-bridges of a full-bridge interleaved power converter.

15. The pulse width modulation amplification system of claim 12 where the first and second switch-mode power stages comprise positive and negative current halves of an opposed current converter.

16. The pulse width modulation amplification system of claim 12 where the delay unit is a pulse delay unit.

17. The pulse width modulation amplification system of claim 12 where the delay unit is operable to time offset the second pulse modulated signal with respect to the first pulse modulated signal by phase shifting a triangular modulating waveform used by the second pulse width modulator relative to a phase of a triangular modulating waveform used by the first pulse width modulator.

18. The pulse width modulation amplification system of claim 12 where the bypass circuit is transferable between the first and second states by engagement or disengagement of a switch.

19. The pulse width modulation amplification system of claim 12 further comprising a second delay unit connected with the first pulse width modulator and operable to reduce the time offset of the second pulse width modulated signal with respect to the first pulse width modulated signal by introduction of a period of delay to the first pulse width modulated signal.

20. The pulse width modulation amplification system of claim 12, further comprising a timer connected with the level detector and the bypass circuit.

21. The pulse width modulation amplification system of claim 20 where the timer is operable to automatically adjust the amount of the time offset generated by the delay unit.

22. The pulse width modulation amplification system of claim 20 where the timer is operable to direct the delay unit to set a time period for a delay.

23. The pulse width modulation amplification system of claim 12 where the level detector is operable to direct the delay unit to provide a desired time offset.

24. The pulse width modulation amplification system of claim 12 where the first and second pulse width modulators are contained on an integrated circuit.

25. The pulse width modulation amplification system of claim 12 where the level detector comprises a latch, the latch connected with the first pulse width modulator and the delay unit.

26. A method for controlling a time delay in a pulse width modulation amplifier, comprising:
   generating a first pulse width modulated signal with a first pulse width modulator connected with a first switch-mode power stage;
   generating a second pulse width modulated signal with a second pulse width modulator connected with a second switch-mode power stage;
   analyzing a level of an input signal;
   comparing the level of the input signal with a threshold; and
   automatically adjusting a time offset between the second pulse width modulated signal and the first pulse width modulated signal based on the comparison.

27. The method of claim 26 where the act of automatically adjusting a time offset comprises automatically reducing the time offset when the level of the input signal is above the threshold.

28. The method of claim 26 where the act of automatically adjusting a time offset comprises automatically reducing the time offset when the level of the input signal is greater than or equal to the threshold.

29. The method of claim 26 where the act of automatically adjusting a time offset comprises automatically increasing the time offset when the level of the input signal is below the threshold.

30. The method of claim 26 where the act of automatically adjusting a time offset comprises automatically increasing the time offset when the level of the input signal is less than or equal to the threshold.

31. The method of claim 26 where comparing further comprises the act of determining if the level of the input signal has been above or below a threshold for a period of time.

32. A method for controlling a time delay in a pulse width modulation amplifier, comprising:
   providing a first pulse width modulator connected with a first switch-mode power stage;

providing a second pulse width modulator connected with a second switch-mode power stage;

time offsetting a second pulse width modulated signal generated with the second pulse width modulator with respect to a first pulse width modulated signal generated with the first pulse width modulator;

analyzing a level of an input signal;

determining that the level of the input signal has been above a threshold for a period of time; and automatically adjusting the time offset in response to the determination that the level of the input signal has been above a threshold for a period of time.

33. The method of claim 32 where the act of automatically adjusting the time offset comprises decreasing the time offset in response to the determination that the level of the input signal has been above a threshold for a period of time.

34. The method of claim 32 where the act of automatically adjusting the time offset comprises substantially removing the time offset in response to the determination that the level of the input signal has been above a threshold for a period of time.

35. In a computer readable storage medium having stored therein data representing instructions executable by a processor for controlling a time delay in a pulse width modulation amplifier, the storage medium comprising instructions for:

receiving an input signal;

generating a first pulse width modulated signal based on the input signal;

generating a second pulse width modulated signal based on the input signal, the second pulse width modulated signal having a time offset with respect to the first pulse width modulated signal;

analyzing a level of the input signal; and automatically adjusting the time offset as a function of the level.

36. The computer readable storage medium of claim 35 where the act of automatically adjusting the time offset comprises automatically decreasing the time offset.

37. The computer readable storage medium of claim 35 where the act of automatically the time offset comprises automatically substantially removing the time offset.

38. The computer readable storage medium of claim 35 where the act of automatically adjusting the time offset comprises automatically increasing the time offset.

39. The computer readable storage medium of claim 35 where analyzing a level of the input signal comprises determining if the input signal has been above a threshold for a period of time.

* * * * *

UNITED STATES PATENT AND TRADEMARK OFFICE
CERTIFICATE OF CORRECTION

PATENT NO. : 7,778,324 B2  Page 1 of 1
APPLICATION NO. : 11/283035
DATED : August 17, 2010
INVENTOR(S) : Gerald R. Stanley It is certified that error appears in the above-identified patent and that said Letters Patent is hereby corrected as shown below:

In Column 14, line 15, after --automatically-- add "adjusting".

Signed and Sealed this

Second Day of November, 2010

David J. Kappos
*Director of the United States Patent and Trademark Office*